US008491162B2

(12) United States Patent
Lee

(10) Patent No.: US 8,491,162 B2
(45) Date of Patent: Jul. 23, 2013

(54) LED LAMP

(75) Inventor: Ke-Chin Lee, Taipei (TW)

(73) Assignee: Zhongshan Weiqiang Technology Co., Ltd., Guangdong (CN)

( * ) Notice: Subject to any disclaimer, the term of this patent is extended or adjusted under 35 U.S.C. 154(b) by 484 days.

(21) Appl. No.: 12/802,965

(22) Filed: Jun. 17, 2010

(65) Prior Publication Data

US 2010/0259942 A1 Oct. 14, 2010

Related U.S. Application Data

(63) Continuation-in-part of application No. 12/319,995, filed on Jan. 14, 2009, now abandoned.

(51) Int. Cl.
*F21V 29/00* (2006.01)
*H05K 7/20* (2006.01)

(52) U.S. Cl.
USPC .............. 362/294; 313/46; 362/373; 361/719

(58) Field of Classification Search
USPC ...................... 313/46; 362/373, 294; 361/719
See application file for complete search history.

(56) References Cited

U.S. PATENT DOCUMENTS 7,101,055 B2 9/2006 Hsieh et al.
7,144,135 B2 12/2006 Martin et al.
7,210,832 B2 5/2007 Huang
7,434,984 B2 10/2008 Hiranuma et al.
2004/0243016 A1 12/2004 Sanderson et al.
2005/0092469 A1* 5/2005 Huang .......................... 165/126
2008/0117637 A1* 5/2008 Chang et al. .................. 362/294

FOREIGN PATENT DOCUMENTS

CN 1971133 5/2007
CN 201059523 5/2008
CN 201066109 5/2008
CN 201078684 6/2008
CN 201083371 7/2008
CN 101749682 6/2010
JP 2003-288806 10/2003
JP 2004-186109 7/2004
JP 5066753 8/2012
WO WO 2008/011723 1/2008

OTHER PUBLICATIONS

U.S. Appl. No. 12/319,995, filed Jan. 15, 2009, Lee.

* cited by examiner

*Primary Examiner* — Anne Hines
*Assistant Examiner* — Jacob R Stern
(74) *Attorney, Agent, or Firm* — William E. Pelton, Esq.; Cooper & Dunham LLP

(57) ABSTRACT

An LED lamp has a metal housing, a sintered heat pipe and an LED. The metal housing has an outer surface, an inner surface, a bottom and an opening defined by an inner edge. The sintered heat pipe engages the inner surface and the bottom and the inner edge of the metal housing. The LED is attached to a flattened area of the bottom portion of the sintered heat pipe. The sintered heat pipe rapidly transports heat generated by the LED to the metal housing which then transfers heat to the environment. The sintered heat pipe makes effective heat transportation possible and allows the use of high-power LEDs or multiple LED's within one lamp.

1 Claim, 13 Drawing Sheets

LED LAMP

The present invention is a continuation-in-part application that claims the benefit of U.S. patent application Ser. No. 12/319,995 filed on Jan. 14, 2009 now abandoned.

BACKGROUND OF THE INVENTION

1. Field of the Invention

The field of this invention is electric lamps and, in particular, LED (light-emitting diode) lamps.

2. Description of the Prior Art

With reference to FIG. 16, a conventional LED lamp generally comprises a metal rod 91 having two ends and an outer surface. An LED 92 is attached to one end of the metal rod 91. Heat-transferring fins are annularly attached to and radially protrude from the outer surface of the metal rod 91. A base 94 is attached to the other end of the metal rod 91 and leads 96 protrude outward from the base 94 electrically to connect the LED 92 to a power source. A cover 95 overlies the LED 92. The cover 95 alters the illuminating pattern of the LED lamp and protects other structures of the LEDs lamp.

However, the metal rod 91 is not capable of satisfying heat transportation. Heat generated by the LED 92 during operation may not be effectively transferred, which forbids using high-power LED or using multiple LEDs within one LED lamp.

Wither reference to FIG. 17, a conventional LED system using no sintered heat pipe has an LED mounted onto a MCPCB. The MCPCB is attached to a receiving plate of a heat sink. The temperature of the LED itself and the temperatures of the following measurement points are also measured. The measure points include different points T1, T2 of the MCPCB, different points T3, T4 of the receiving plate and fins T5-T9 of the heat sink. The temperature readings are listed in Table 1.

TABLE 1

| Input | temperature (° C.) | | | | | | | | |
|---|---|---|---|---|---|---|---|---|---|
| | T1 | T2 | T3 | T4 | T5 | T6 | T7 | T8 | T9 |
| 0.5 A * 23.7 V = 11.85 W | 51.98 | 52.22 | 46.43 | 45.77 | 44.01 | 45 | 47.59 | 46.08 | 46.5 |
| 0.75 A * 23.9 V = 17.925 W | 62.65 | 63.46 | 54.47 | 53.58 | 50.5 | 52.41 | 56.16 | 53.87 | 54.53 |
| 1 A * 23.9 V = 23.9 W | 72.03 | 72.63 | 61.54 | 60.35 | 56.38 | 58.7 | 63.8 | 60.76 | 61.63 |

With reference to FIG. 18, calculated temperatures of the MCPCB of the LED and the heat sink and the temperature of the LED are further listed in Table 2

TABLE 2

| Input | temperature (° C.) | | |
|---|---|---|---|
| | MCPCB | Heat sink | LED |
| 0.5 A * 23.7 V = 11.85 W | 52.1 | 45.836 | 87.65 |
| 0.75 A * 23.9 V = 17.925 W | 63.055 | 53.494 | 116.83 |
| 1 A * 23.9 V = 23.9 W | 73.33 | 60.254 | 144.03 |

The temperature of the MCPCB is considerably higher than that of the heat sink, which indicates an accumulation of the heat generated by the LED around MCPCB. The phenomenon demonstrates the high heat-transfer resistance of the MCPCB constitutes a proximal heat-transfer resistance in the conventional system that is responsible to the accumulation of heat.

Accordingly, an LED lamp is needed that will mitigate or obviate the aforementioned problems.

SUMMARY OF THE INVENTION

An embodiment of an LED lamp has a metal housing, a sintered heat pipe and an LED.

In one embodiment, a metal housing is bowl-shaped and comprises an inner surface, an outer surface, a bottom and an opening. The opening of the metal housing has an inner edge. The sintered heat pipe is thermally attached to the inner surface of the metal housing. The sintered heat pipe has a first end, a second end, a bottom portion and a second portion. The bottom portion is defined between the first end and the second end of the sintered heat pipe and is positioned to the bottom of the metal housing and has a flattened area. The second portion is defined between the second end and the bottom portion of the sintered heat pipe and thermally attached to the inner surface of the metal housing. The LED is attached to the flattened area of the bottom portion of the sintered heat pipe.

The sintered heat pipe, which is by nature capable of highly effective heat sinking, rapidly transports the heat generated by the LED to the metal housing. The metal housing then transfers the heat to the environment. The sintered heat pipe makes effective heat transportation possible and allows the use of high-powered or multiple LED's within one lamp.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
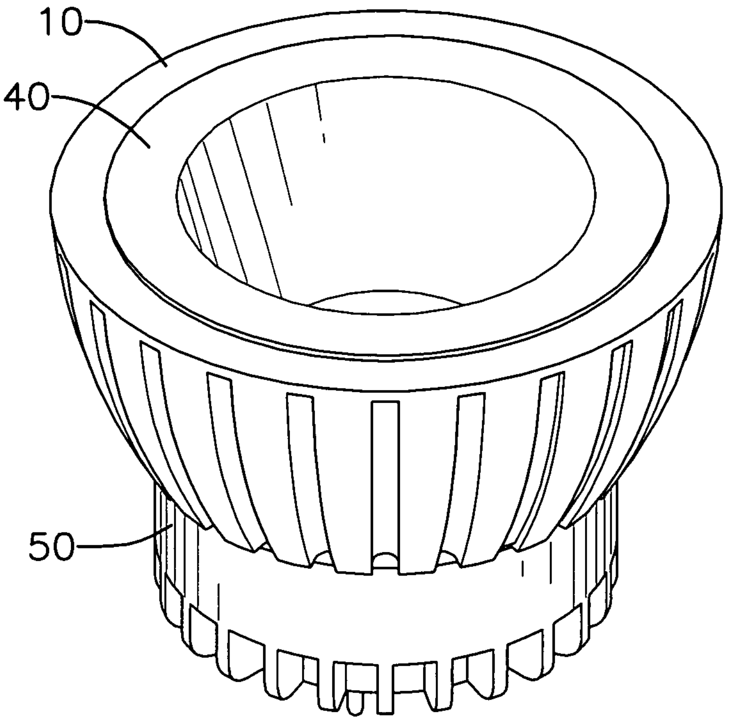
FIG. 1 is a perspective view of an LED lamp in accordance with the present invention.
Figure 2:
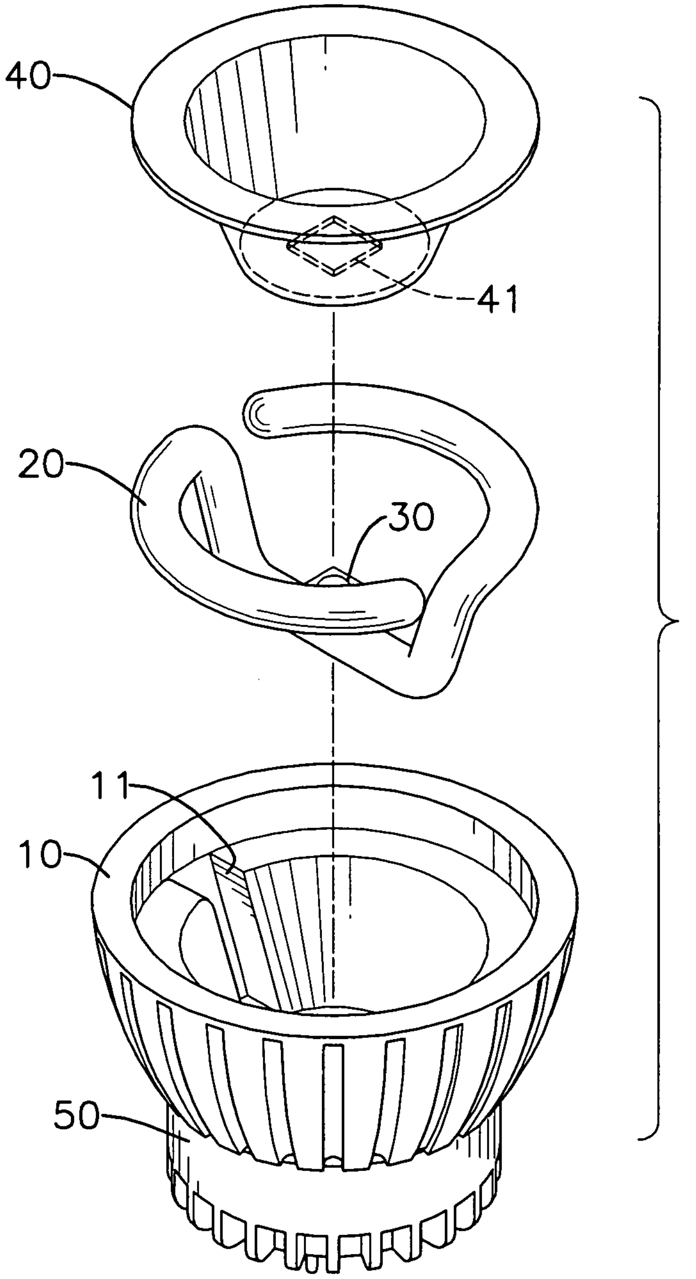
FIG. 2 is an exploded perspective view of the LED lamp of FIG. 1.

With reference to FIGS. 1 and 2, there is depicted an LED lamp embodiment having a metal housing 10, a sintered heat pipe 20 and an LED 30. The metal housing 10 is bowl-shaped and comprises an outer surface, an inner surface, a bottom and an opening, wherein the opening has an inner edge. The inner surface of the metal housing 10 may be formed with one or more grooves. Preferably, the metal housing 10 further comprises multiple exterior fins for effective heat releasing. The multiple fins protrude from the outer surface of the metal housing 10. A base 50 may be attached to the outer surface corresponding to the bottom of the metal housing 10. The base 50 allows attachment of accessories and convenient usage.

The sintered heat pipe 20 is mounted within the open metal housing 10 and is thermally attached to the inner surface, the bottom and the inner edge of the metal housing 10. The sintered heat pipe 20 has a first end, a second end and a bottom portion. The bottom portion is defined between the first end and the second end and positioned toward the bottom of the metal housing 10. The bottom portion may have a flatten area. In an embodiment, the bottom portion of the sintered heat pipe engages an interior surface of the bottom of the housing.

When the inner surface of the metal housing 10 is formed with one or more grooves, that the sintered heat pipe 20 is received in the one or more grooves is preferred. The sintered heat pipe 20 may be welded or otherwise adhered to the inner surface of the metal housing 10 by using various thermal sticking agents, especially a thermal grease. With any of the aforementioned or other attaching means, the sintered heat pipe 20 is attached to and thermally contacts the inner surface of the metal housing 10.

The LED 30 is attached to the flatten area of the bottom portion of the sintered heat pipe 20. The LED 30 emits lights that radiate outward through the opening of the metal housing 10. In order to receive power for operation, the LED 30 is electrically connected to a power source providing an alternating current or a direct current.

The LED lamp may further comprise a controller electrically connected to the LED 30 and the power source. The controller is configurable for controlling the LED 30 such that the LED 30, for example, may switch between on-off status or to alternative illumination patterns. An artisan in the field of the present invention would appreciate the structure and installation of a suitable controller that need not be described herein.

Heat generated by the LED 30 during operation will be rapidly transported by the sintered heat pipe 20 to the metal housing 10 and then sequentially transferred to the environment from the outer surface of the metal housing 10. The sintered heat pipe 20 makes effective heat transportation possible and allows the use of high-powered or multiple LED's within one lamp.

Figure 3:
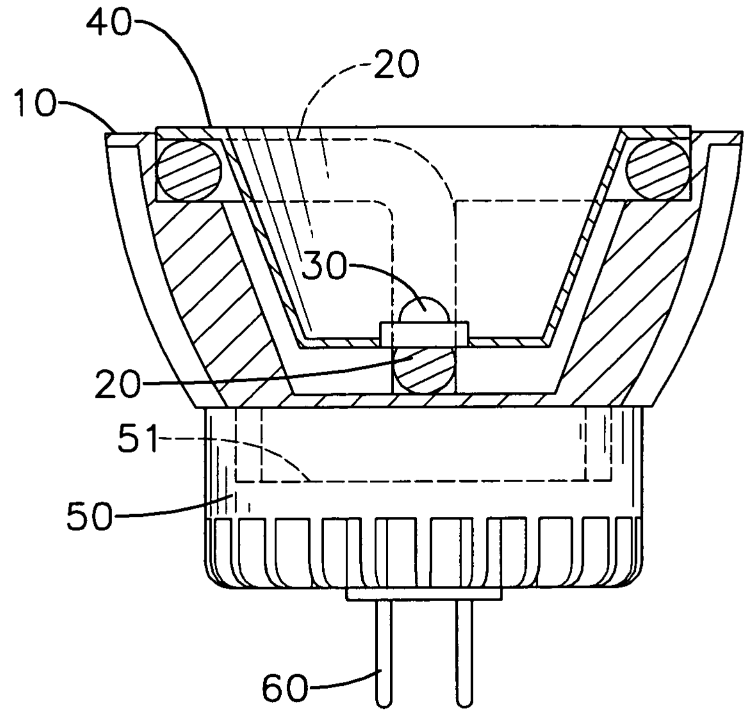
FIG. 3 is a partial lateral cross-sectional view of the LED lamp of FIG. 1.
Figure 4:
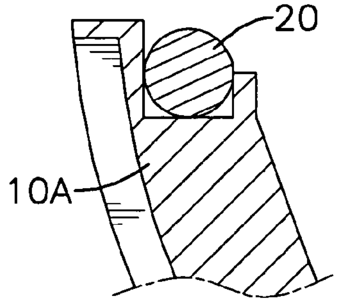
FIGS. 4 to 10 are cross sectional side views of embodiments of LED lamps in accordance with the present invention.
Figure 5:
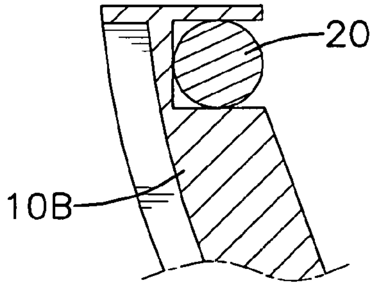
Figure 6:
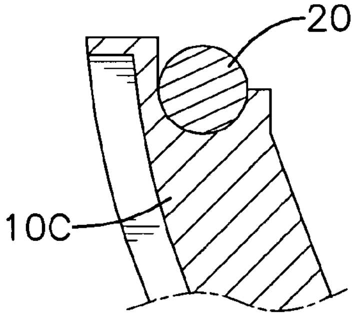
Figure 7:
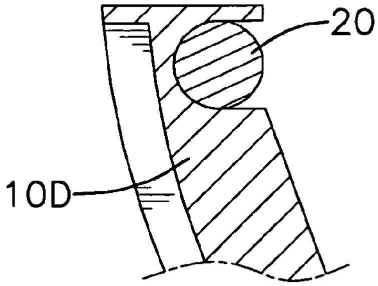
Figure 8:
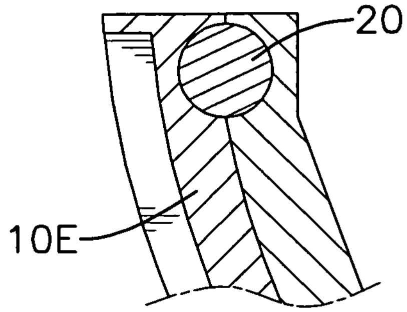
Figure 9:
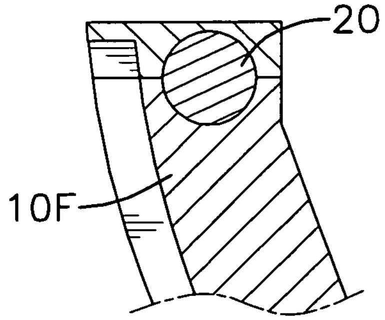
Figure 10:
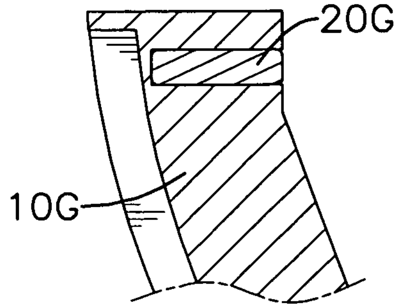

With reference to FIG. 3, an embodiment of the sintered heat pipe 20 further has an upper portion. The upper portion is attached to and thermally contacting the inner edge of the metal housing 10. The inner edge may be formed by an inner positioning groove or recession formed near the opening of the metal housing 10 and adapted to receive the upper portion of the sintered heat pipe 20, as described in more detail below. In an embodiment of the LED lamp, the sintered heat pipe 20 has two lateral parts extending between the upper portion and the bottom portion of the sintered heat pipe. With further reference to FIG. 2, the metal housing 10 may have one or more grooves 11 formed axially on the inner surface of the metal housing 10. The bottom portion of the sintered heat pipe 20 is attached to the bottom of the metal housing 10. Each of the grooves 11 extends from the bottom of the housing to the opening of the metal housing 10. The lateral parts of the sintered heat pipe 20 are respectively inserted in the grooves 11 and thermally connect the bottom, the inner surface and the inner edge of the opening of the metal housing 10. The shape and structure of the sintered heat pipe 20 and inner edge of the opening of the metal housing 10 may be modified by persons skilled in the relevant art for attachment and thermal contact without departing from the scope of the invention. By way of example only, and with reference to FIG. 3, the inner edge of the opening of the metal housing 10 may form a recession. With reference to FIGS. 4 and 5, the recession may be defined by a groove with a flat bottom formed axially or radially into the inner surface of the metal housing 10A, 10B. With reference to FIGS. 6 and 7, a groove formed axially or radially into the metal housing 10C, 10D may have a round bottom. With reference to FIGS. 8 and 9, the sintered heat pipe 20 may be embedded in the metal housing 10E, 10F. With reference to FIG. 10, a radial slit may be formed into the metal housing 10G and a flat sintered heat pipe 20G may be inserted in the slit. The recession may be peripheral as depicted in FIG. 2, or otherwise as determined by the skilled artisan.

With further reference to FIG. 3, a lead pair 60 may be used as a means to electrically connect the LED 30 to a suitable power source. The lead pair 60 protrudes out from the base 50 that is attached to the outer surface of the metal surface 10. The base 50 may further have a receiving space 51. The receiving space 51 is capable of receiving a controller being for example a suitable electronic circuit. A skilled artisan would appreciate that a suitable electronic circuit may be used to control the on-off state of the LED 30 and even the illumination pattern or style of the LED 30.

Figure 11:
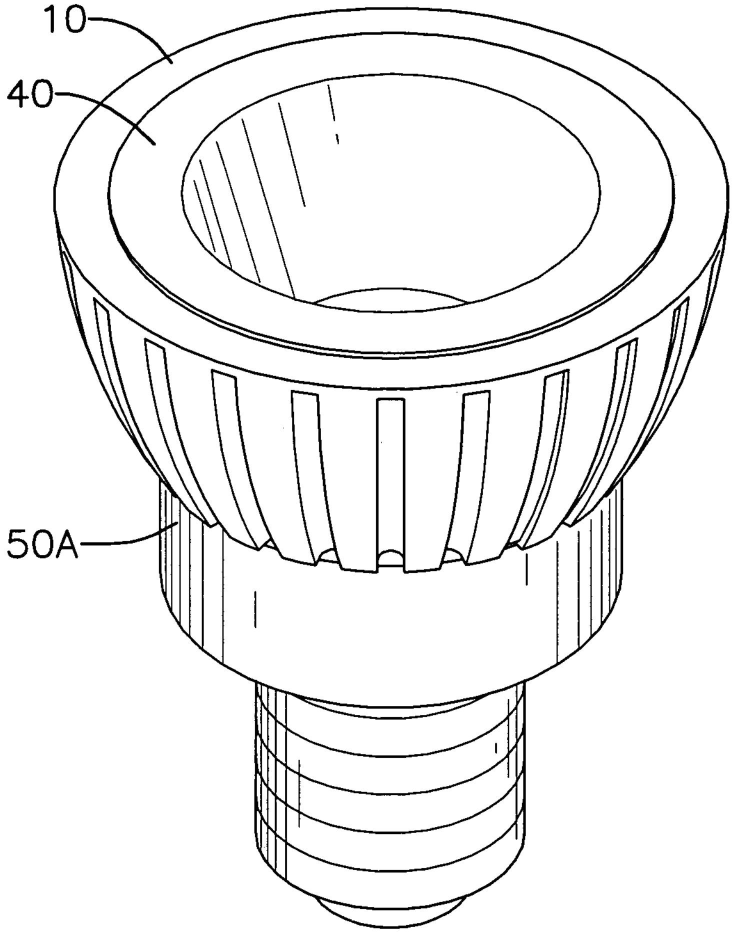
FIG. 11 is a perspective view of another embodiment of an LED lamp in accordance with the present invention.

With reference to FIG. 11, a substantially tubular base 50A may also serve as a means to connect the LED 30 to a power source. In an embodiment, the tube extends from the outer surface of the bottom of the metal housing 10. The tubular base has a sealed end, an inner surface, an outer surface and a thread defined on the outer surface. The LED 30 is suitably electrically connected to a power source through the base 50A. The base 50A is engaged mechanically and electrically with a threaded socket that is electrically connected to the power source. In an embodiment, the base 50, 50A may be designed to engage with a MR-16 or E27 socket. A skilled artisan may modify or choose suitable base or electrical contact structure for electrically connecting the LED 30 to a power source without departing from the scope of the invention. With further reference to FIGS. 1 and 2, in an embodiment the LED lamp may further comprise a cover 40. The cover 40 covers the inner edge of the opening of the metal housing 10. The cover may be annular or it may be cup-like and may define a hole 41. The hole 41 allows the light emitted from the LED 30 to pass through it. The cover 40 helps to provide a different visual appearance of the LED lamp and protect the sintered heat pipe 20 located in the inner edge of the opening of the metal housing 10. In an embodiment, the cover 40 may be constructed of a material having a reflecting surface or may have a reflecting material applied to a surface upon which light from the LED is incident. Accordingly, the light emitted from the LED 30 can alternatively illuminate and provide different lighting or decoration effects.

Figure 12:
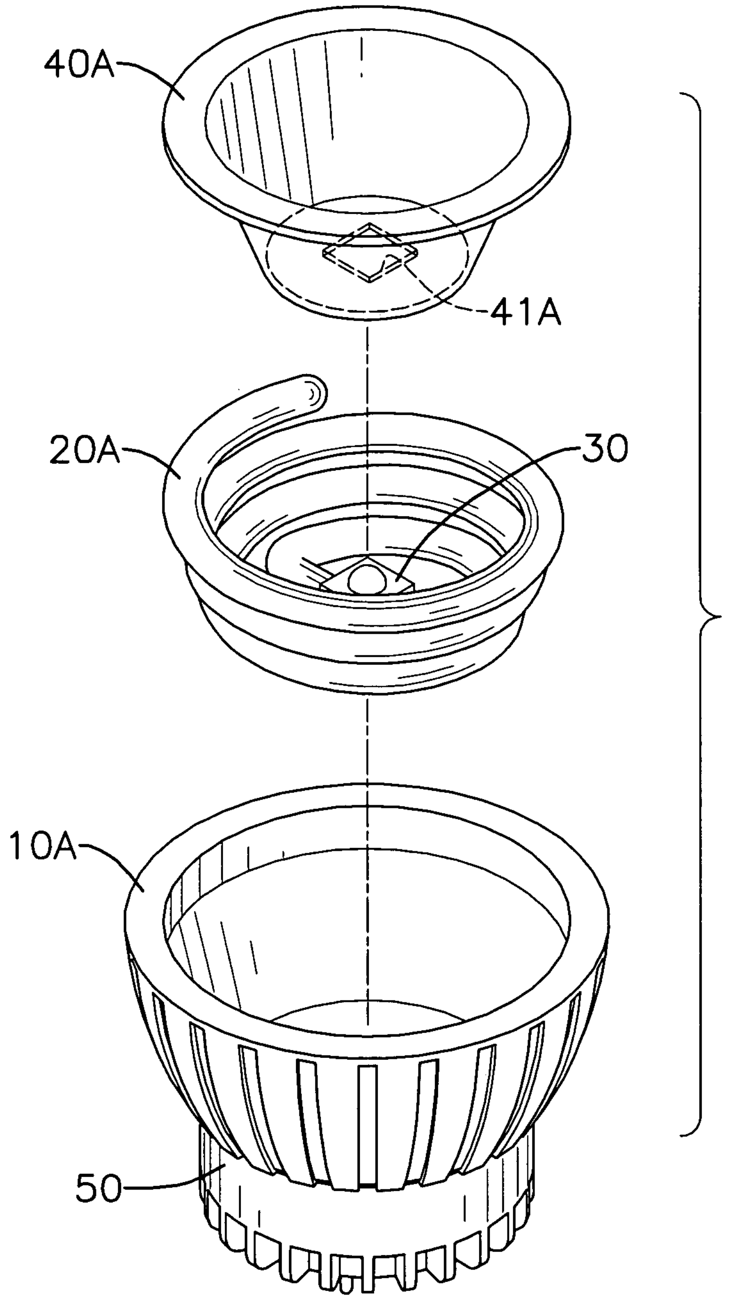
FIG. 12 is an exploded perspective view of an LED lamp in accordance with the present invention having a spiraling heat pipe.
Figure 13:
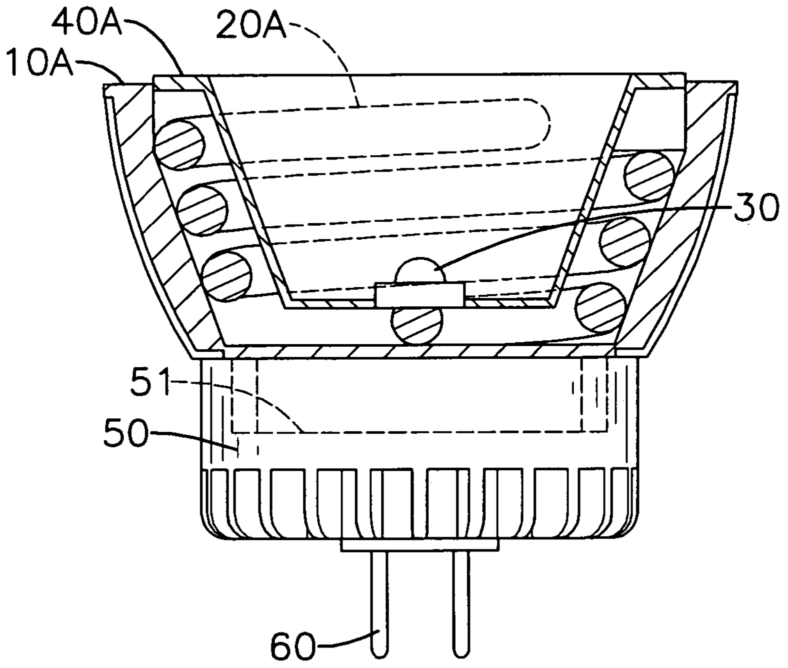
FIG. 13 is a side view, partially in cross-section of the LED lamp of FIG. 4.

With reference to FIGS. 12 and 13, a sintered heat pipe 20A of another embodiment spirals on and thermally contacts the inner surface, the bottom and the inner edge of the metal housing 10A. The sintered heat pipe 20A has a first end, a second end, a bottom portion and a second portion. The bottom portion is defined between the first end and the second end of the sintered heat pipe 20A and positioned to the bottom of the metal housing and has a flattened area. Preferably, the flattened area is adjacent to the first end. The second portion is defined between the second end and the bottom portion of the sintered heat pipe 20A and thermally attached to the inner surface of the metal housing 10A.

The sintered heat pipe 20A may engage the inner surface of the metal housing 10A or be attached to the metal housing in various ways including adhered or welded to the inner surface of the metal housing 10A without departing from the scope of the invention. With further reference to FIGS. 4-10, the metal housing 10A may have any of the aforementioned receiving structure for receiving the second portion, which spirals on the inner surface of the metal housing 10 A, of the sintered heat pipe 20A. Other feasible techniques would also be suitable for the attachment of the sintered heat pipe 20A to the inner surface of the metal housing 10A. Preferably, as aforementioned with reference to FIG. 2, the metal housing 10A may have a peripheral recession at the inner edge of the metal housing 10A. With further reference to FIG. 3, more preferably the sintered heat pipe 20A further has an upper portion defined between the second portion and the second end of the sintered heat pipe 20A. The upper portion is attached to and thermally contacting the peripheral recession at the inner edge of the metal housing 10A.

A cover 40A may also be attached to the inner edge of the opening of the metal housing 10A for alternative lighting or decorating effects. In order to conveniently engage to the power source, the embodiment of the LED lamp may further comprise the aforementioned base 50, 50A or lead pair 60.

Figure 14:
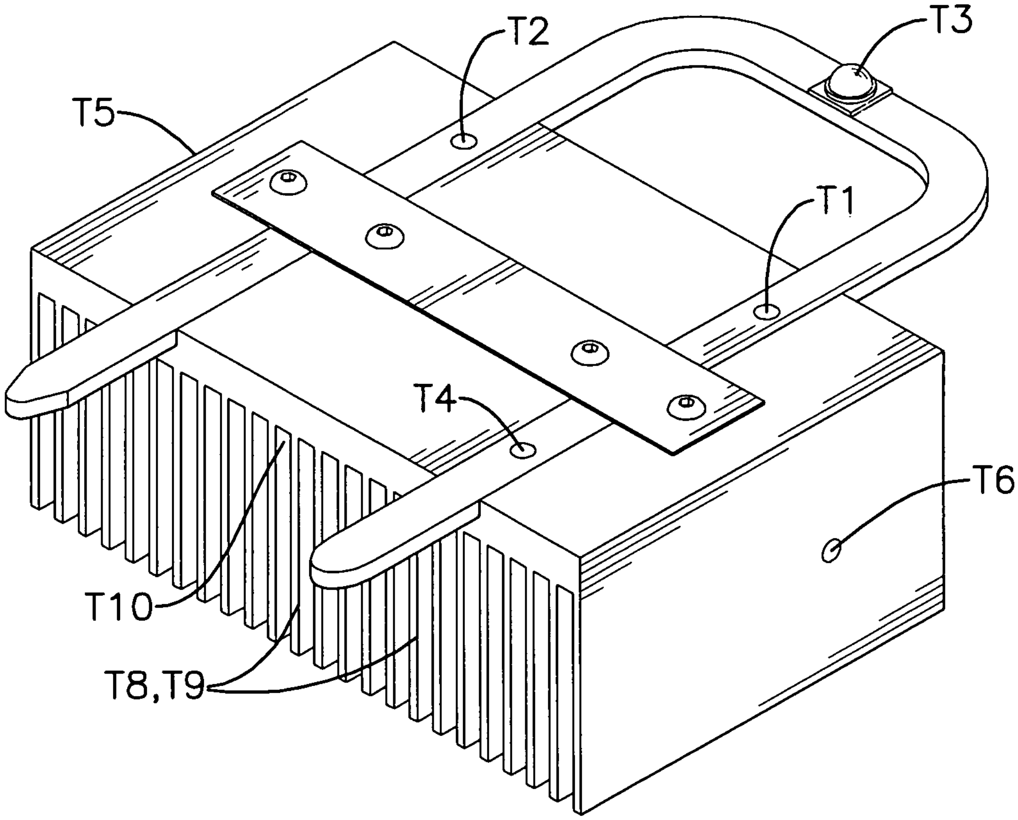
FIG. 14 is a YCTC LED system having a sintered heat pipe attached to a heat sinker and an LED attached to the sintered heat pipe.

With reference to FIG. 14, a YCTC LED system is used to demonstrate the heat distribution therewithin. The system has a sintered heat pipe attached to a heat sinker and an LED attached to the sintered heat pipe. The system is placed in an environment allowing air convention at room temperature or 25° C. and achieves stable equilibrium when the temperatures of the measurement points T1-T10 stop raising. The measurement points include heat-sinking portions T1, T2, a heating point T3 whereto an LED is attached and a non-effective terminal T4 of the sintered heat pipe, and a receiving plate T5 and fins T8-T10 of the heat sink. The temperature of the LED itself is also measured. The temperature readings are listed in Table 3.

TABLE 3

| Input | temperature (° C.) | | | | |
|---|---|---|---|---|---|
| | T1 | T2 | T3 | T4 | T5 |
| 0.5 A * 24.5 V = 12.25 W | 47.41 | 47.36 | 46.68 | 44.78 | 45.25 |
| 0.75 A * 25 V = 18.75 W | 55.75 | 55.69 | 54.66 | 52.11 | 52.39 |
| 1 A * 25.4 V = 25.4 W | 64.08 | 64 | 62.75 | 59.76 | 59.9 |
| | temperature (° C.) | | | | |
| Input | T6 | T7 | T8 | T9 | T10 |
| 0.5 A * 24.5 V = 12.25 W | 43.83 | 44.34 | 45.91 | 45.66 | 45.67 |
| 0.75 A * 25 V = 18.75 W | 50.35 | 50.82 | 53.31 | 53.15 | 53.2 |
| 1 A * 25.4 V = 25.4 W | 56.88 | 57.1 | 60.78 | 60.57 | 60.56 |

Figure 15:
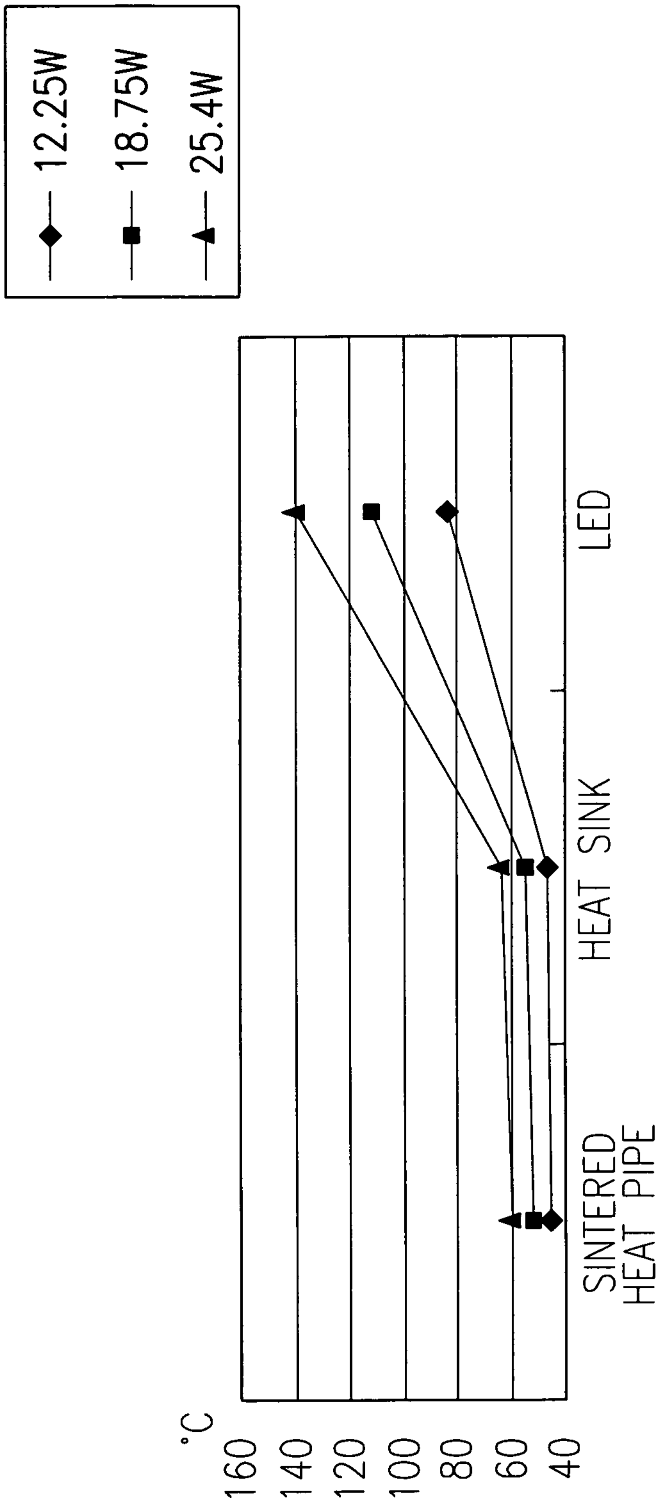
FIG. 15 is a graph depicting heat distribution of the system in FIG. 14 in stable equilibrium.
Figure 16:
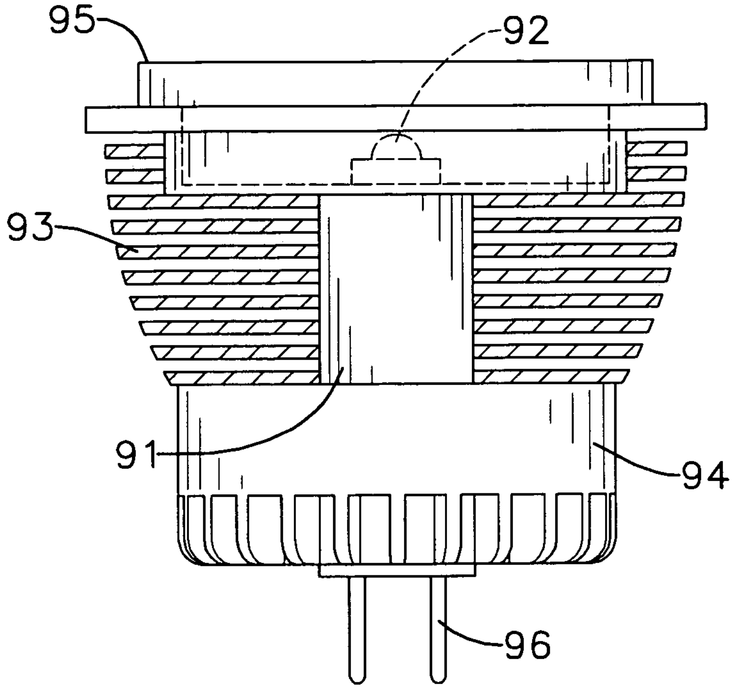
FIG.16 PRIOR ART
FIG. 16 is a side view, partially in cross section, of a conventional LED lamp in accordance with the prior art.
Figure 17:
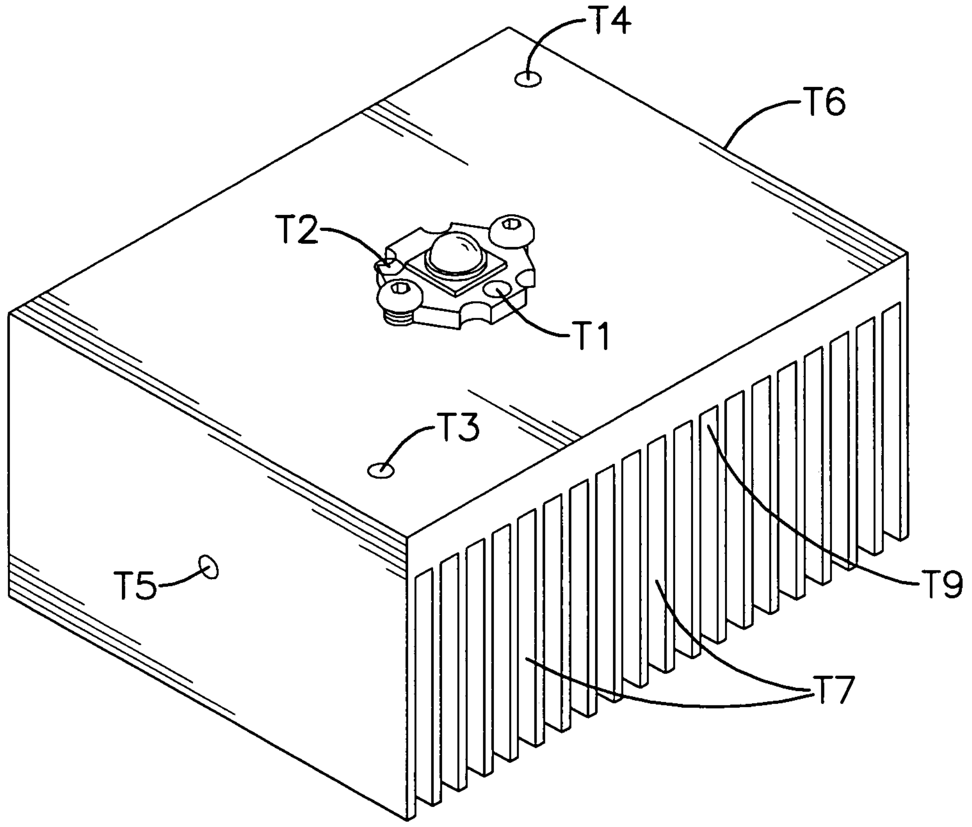
FIG. 17 PRIOR ART
FIG. 17 is a system having an LED attached to a heat sinker in accordance with the prior art.
Figure 18:
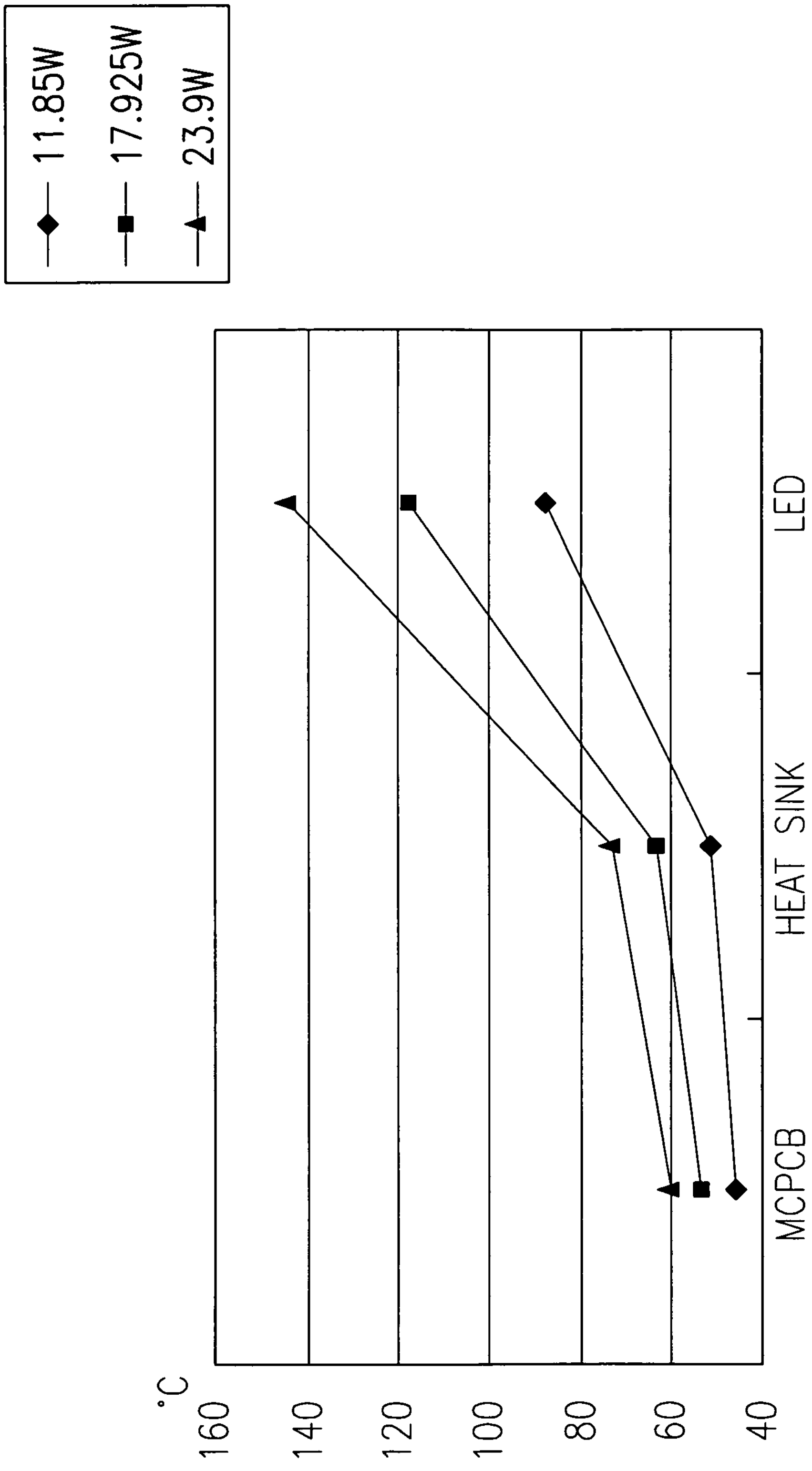
FIG.18 PRIOR ART
FIG. 18 is a graph depicting heat distribution of the system in FIG. 17 in stable equilibrium.

Calculated temperatures of the sintered heat pipe and the heat sink and the temperature of the LED are further listed in Table 4. A graph is made based on Table 4. With reference to FIG. 15, using the sintered heat pipe leads to a relief of proximal heat-transfer resistance. The LED and the sintered heat pipe in Table 4 demonstrated lower temperatures than that of the LED and MCPCB in Table 2, which significantly indicates that the heat generated by the operating LED does not accumulate as seriously as that happens in a conventional system.

TABLE 4

| Input | temperature (° C.) | | |
|---|---|---|---|
| | Sintered heat pipe | Heat sink | LED |
| 0.5 A * 23.7 V = 11.85 W | 46.5575 | 45.11 | 83.3075 |
| 0.75 A * 23.9 V = 17.925 W | 54.5525 | 52.20333 | 110.8025 |
| 1 A * 23.9 V = 23.9 W | 62.6475 | 59.29833 | 138.8475 |

Even though numerous characteristics and advantages of the various described embodiments have been set forth in the foregoing description, together with details of the structure and features, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An LED lamp comprising
a metal housing being bowl-shaped and comprising
an inner surface;
an outer surface;
a bottom;
an opening having an inner edge, wherein the inner edge comprises a recession; and
two grooves formed axially on the inner surface, each extending from the bottom to the opening of the metal housing;
a sintered heat pipe thermally attached to the inner surface, the bottom and the inner edge of the metal housing and comprising
a first end;
a second end;
a bottom portion defined between the first end and the second end, positioned to the bottom of the metal housing and comprising
a flattened area;
an upper portion being attached to and thermally contacting the inner edge of the opening of the metal housing, wherein the upper portion is received in the recession of the inner edge; and
two lateral parts extending between the upper portion and the bottom portion, respectively inserted and welded in the grooves and thermally connect the bottom, the inner surface and the inner edge of the opening of the metal housing;
an LED attached to the flattened area of the bottom portion of the sintered heat pipe; and
a cover covering the inner edge of the opening of the metal housing and comprising a hole allowing a light emitted from the LED to pass through, wherein the cover protects the sintered heat pipe located in the inner edge of the opening of the metal housing.

* * * * *